(12) United States Patent
Romero et al.

(10) Patent No.: US 10,444,299 B2
(45) Date of Patent: *Oct. 15, 2019

(54) MAGNETIC FIELD SENSOR'S FRONT END AND ASSOCIATED MIXED SIGNAL METHOD FOR REMOVING CHOPPER'S RELATED RIPPLE

(71) Applicant: Allegro MicroSystems, LLC, Manchester, NH (US)

(72) Inventors: Hernán D. Romero, Buenos Aires (AR); Octavio H. Alpago, Ciudad de Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 214 days.

This patent is subject to a terminal disclaimer.

(21) Appl. No.: 15/700,603

(22) Filed: Sep. 11, 2017

(65) Prior Publication Data

US 2019/0079143 A1    Mar. 14, 2019

(51) Int. Cl.
*G01R 33/00* (2006.01)
*H03F 3/38* (2006.01)
(Continued)

(52) U.S. Cl.
CPC ......... *G01R 33/0041* (2013.01); *G01D 3/036* (2013.01); *G01R 33/0029* (2013.01);
(Continued)

(58) Field of Classification Search
CPC ............ G01R 33/0041; G01R 33/0029; G01R 33/075; G01D 3/036; H03G 1/04;
(Continued)

(56) References Cited

U.S. PATENT DOCUMENTS 5,619,137 A    4/1997  Vig et al.
5,621,319 A    4/1997  Bilotti et al.
(Continued)

OTHER PUBLICATIONS

Wu et al.; "A Chopper Current-Feedback Instrumentation Amplifier with a 1mHz 1/f Noise Corner and an AC-Coupled Ripple-Reduction Loop;" 2009 IEEE International Solid-State Circuits Conference; ISSCC 2009/Session 19/Analog Techniques/19.1; Feb. 2009; 3 pages.

(Continued)

*Primary Examiner* — Patrick Assouad
*Assistant Examiner* — Haidong Zhang
(74) *Attorney, Agent, or Firm* — Daly, Crowley, Mofford & Durkee, LLP

(57) ABSTRACT

A sensor circuit is provided with a chopper-stabilized amplifier circuit configured to receive a signal from at least one magnetic sensing element, a sigma-delta modulator (SDM) configured to receive a signal from the chopper-stabilized amplifier circuit, and a feedback circuit configured to reduce ripple in a signal generated by the chopper-stabilized amplifier circuit. The feedback circuit includes a demodulator to demodulate a signal from the SDM in a digital domain by inverting a bit stream of the signal from the SDM according to a frequency chopping rate, a digital integrator configured to integrate an output signal of the demodulator to form an integrated signal, and a digital-to-analog converter (DAC) configured to convert the integrated signal to an analog signal and provide the analog signal to the chopper-stabilized amplifier circuit.

24 Claims, 4 Drawing Sheets

(51) Int. Cl.
- *H03G 1/04* (2006.01)
- *H03H 17/02* (2006.01)
- *G01D 3/036* (2006.01)
- *H03M 3/00* (2006.01)

(52) U.S. Cl.
CPC .............. *H03F 3/38* (2013.01); *H03G 1/04* (2013.01); *H03H 17/025* (2013.01); *H03H 17/0219* (2013.01); *H03M 3/458* (2013.01)

(58) Field of Classification Search
CPC .. H03H 17/025; H03H 17/0219; H03F 3/387; H03F 3/45475; H03F 3/45977; H03F 1/26; H03F 2200/408; H03F 2200/331; H03F 2203/45528; H03F 3/38; H03M 1/00; H03M 3/458; H01L 43/04
See application file for complete search history.

(56) References Cited

U.S. PATENT DOCUMENTS

| | | | |
|---|---|---|---|
| 6,154,027 A | 11/2000 | Alexander et al. | |
| 6,522,131 B1 | 2/2003 | Hiligsmann et al. | |
| 7,292,095 B2 | 11/2007 | Burt et al. | |
| 7,605,647 B1 | 10/2009 | Romero et al. | |
| 7,764,118 B2 | 7/2010 | Kusuda et al. | |
| 7,990,209 B2 | 8/2011 | Romero | |
| 8,542,010 B2 | 9/2013 | Cesaretti et al. | |
| 8,559,554 B2 | 10/2013 | Vossiek et al. | |
| 8,680,846 B2 | 3/2014 | Cesaretti et al. | |
| 8,917,195 B2 * | 12/2014 | Motz ...................... | H03M 1/02 341/110 |
| 9,201,122 B2 | 12/2015 | Cesaretti et al. | |
| 9,645,220 B2 | 5/2017 | Cesaretti et al. | |
| 9,817,083 B2 | 11/2017 | Romero | |
| 2003/0102909 A1 | 6/2003 | Motz | |
| 2003/0225539 A1 | 12/2003 | Motz et al. | |
| 2006/0202692 A1 | 9/2006 | Tatschl et al. | |
| 2007/0114988 A1 | 5/2007 | Rossmann et al. | |
| 2007/0247141 A1 * | 10/2007 | Pastre ................ | G01R 33/0035 324/202 |
| 2008/0094055 A1 * | 4/2008 | Monreal .................. | G01D 3/02 324/117 H |
| 2010/0321105 A1 | 12/2010 | Romero | |
| 2011/0018533 A1 | 1/2011 | Cesaretti et al. | |
| 2011/0215955 A1 | 9/2011 | Motz et al. | |
| 2014/0077873 A1 * | 3/2014 | Motz ...................... | H03F 3/387 330/9 |
| 2016/0294331 A1 | 10/2016 | Ivanov | |
| 2016/0370440 A1 | 12/2016 | Okatake et al. | |
| 2019/0079146 A1 | 3/2019 | Romero | |

OTHER PUBLICATIONS

Bryant, James; "Multipliers vs. Modulators"; Analog Dialogue 47-06; Jun. 1, 2013; 2 pages.
Smith; "Chapter 9: Applications of the DFT/Spectral Analysis of Signals;" The Scientist and Engineer's Guide to Digital Signal Processing, Spectral Analysis Signals; Jan. 1, 1997; 11 pages.
Patent Database Search Results: ACLM/"Spectral Line" in US Patent Collection; 3 pages.
"Amplitude Modulation"; downloaded from https://en.wikipedia.org/wiki/Amplitude_modulation on Mar. 9, 2017; 11 pages.
"Quantization (signal processing)"; downloaded from https://en.wikipedia.org/wiki/Quantization_(signal_processing) on Mar. 9, 2017; 13 pages.
"Johnson-Nyquist noise"; downloaded from https://en.wikipedia.org/wiki/Johnson-Nyquist_noise on Mar. 9, 2017; 7 pages.
"Amplitude Modulation with Square-Waves"; by Professor Bernd-Peter Paris; dated Mar. 3, 1998; downloaded from www.spec.gmu.edu on Mar. 9, 2017; 1 page.
"Communication Systems/Amplitude Modulation;" downloaded from https://en.wikibooks.org/wiki/Communication_Systems/Amplitude_Modulation on Mar. 9, 2017; 14 pages.
"Speech Acoustics: Spectral Analysis of Sound"; by Robert Mannell; downloaded from http://clas.mg.edu.au/speech/acoustics/frequency/spectral.html on Jul. 1, 2016; 10 pages.
"FFT Fundamentals (Sound and Vibration Measurement Suite)"; Nov. 2008 edition; downloaded from http://zone.ni.com on Jul. 1, 2016; 4 pages.
"Spectral Lines", downloaded from http://www.cv.nrao.edu on Jul. 1, 2016; 10 pages.
"Spectral Analysis of Signals", by Petre Stoica and Randolph Moses; 2005 edition Chapter 4; 65 pages.
"Frequency Domain"; downloaded from https://en.wikipedia.org/wiki/Frequency_domain on Mar. 9, 2017; 3 pages.
"Spectral Density", downloaded from https://en.wikipedia.org/wiki/Spectral_density on Mar. 9, 2017; 9 pages.
Restriction Requirement dated Jul. 10, 2014 for U.S. Appl. No. 13/542,103, 5 pages.
Response to Restriction Requirement dated Sep. 29, 2014 for U.S. Appl. No. 13/542,103, 1 page.
Office Action dated Jul. 6, 2015 for U.S. Appl. No. 13/542,103, 36 pages.
Response to Office Action dated Nov. 17, 2015 for U.S. Appl. No. 13/542,103, 21 pages.
Final Office Action dated Mar. 23, 2016 for U.S. Appl. No. 13/542,103, 30 pages.
Response to Final Office Action dated Jun. 17, 2016 for U.S. Appl. No. 13/542,103, 24 pages.
Office Action dated Jun. 30, 2016 for U.S. Appl. No. 13/542,103, 34 pages.
Response to Office Action dated Sep. 21, 2016 for U.S. Appl. No. 13/542,103, 24 pages.
Final Office Action dated Dec. 30, 2016 for U.S. Appl. No. 13/542,103, 10 pages.
Response to Final Office Action dated Mar. 23, 2017 for U.S. Appl. No. 13/542,103, 12 pages.
Notice of Allowance dated Jun. 27, 2017 for U.S. Appl. No. 13/542,103, 11 pages.
Extended European Search Report dated Feb. 14, 2019 for European Application No. 18192809.4; 9 Pages.
U.S. Appl. No. 16/372,603, filed Apr. 2, 2019 of Hernán D. Romero, et al.; 76 pages.
Amendment dated Jul. 17, 2019 for U.S. Appl. No. 15/897,708; 7 pages.
Office Action dated Jun. 26, 2019 for U.S. Appl. No. 15/897,708; 14 pages.
Notice of Allowance dated Aug. 7, 2019 for U.S. Appl. No. 15/897,708; 7 pages.

* cited by examiner

MAGNETIC FIELD SENSOR'S FRONT END AND ASSOCIATED MIXED SIGNAL METHOD FOR REMOVING CHOPPER'S RELATED RIPPLE

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor having a Hall element and electronics to reduce ripple generated by chopping.

BACKGROUND

As is known, there are a variety of types of magnetic field sensing elements, including, but not limited to, Hall Effect elements, magnetoresistance elements, and magnetotransistors. As is also known, there are different types of Hall Effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall Effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch, a proximity detector that senses the proximity of a ferromagnetic or magnetic object, a rotation detector that senses passing ferromagnetic articles, for example, gear teeth, and a magnetic field sensor that senses a magnetic field density of a magnetic field. Magnetic switches are used as examples herein. However, the circuits and techniques described herein apply also to any magnetic field sensor.

It is known that Hall Effect elements exhibit an undesirable DC offset voltage. Techniques have been developed to reduce the DC offset voltage, while still allowing the Hall Effect element to sense a DC magnetic field. One such technique is commonly referred to as "chopping" or "current spinning" and entails driving a Hall Effect element in two or more different directions and receiving output signals at different output terminals as the Hall Effect element is differently driven. In this way, selected drive and signal contact pairs are interchanged during each phase of the chopping and offset voltages of the different driving arrangements tend to cancel toward zero.

Chopping is also a well-known technique applied to amplifiers to reduce an offset component and low frequency noise (i.e., flicker noise) of signals applied to the amplifier. Amplifiers implementing chopping are often referred to as chopper stabilized amplifiers.

Chopping tends to generate undesirable spectral components (i.e., frequency components in the frequency domain) and ripple in the resulting signal, which spectral components and ripple can be removed with filters. While conventional arrangements that use filters can effectively reduce the ripple, it will be understood that the filters tend to reduce a bandwidth or a response time of the magnetic field sensor.

SUMMARY

A sensor circuit is provided with a chopper-stabilized amplifier circuit configured to receive a signal from at least one magnetic sensing element, a sigma-delta modulator (SDM) configured to receive a signal from the chopper-stabilized amplifier circuit, and a feedback circuit configured to reduce ripple in a signal generated by the chopper-stabilized amplifier circuit. The feedback circuit includes a demodulator to demodulate a signal from the SDM in a digital domain by inverting a bit stream of the signal from the SDM according to a frequency chopping rate, a digital integrator configured to integrate an output signal of the demodulator to form an integrated signal, and a digital-to-analog converter (DAC) configured to convert the integrated signal to an analog signal and provide the analog signal to the chopper-stabilized amplifier circuit.

With this arrangement, in which the ripple reduction loop includes the chopper-stabilized amplifier and the SDM, a notch is provided in the signal transfer function of the SDM. More particularly, the notch is provided by demodulating the output of the SDM with demodulator and digitally integrating the result with digital integrator. The ripple reduction achieved with this SDM notch can be sufficient to reduce the ripple to an acceptable level or can be combined with additional filtering outside of the loop. In either case, this described ripple reduction loop has advantages in that performing demodulation and integration in the digital domain avoids analog demodulation issues associated to parasitic capacitances and loading effects and the need for large integrating capacitors that can be costly in terms of area and errors and further that can require constant refresh to accurately hold voltages. Furthermore, by eliminating or at least reducing ripple in the described manner, the SDM will have virtually all of its input dynamic range available to digitize the sensed magnetic field signal (i.e., as opposed to having to process both the sensed signal and chopper generated ripple) and saturation of the SDM can be avoided.

Features may include one or more of the following individually or in combination with other features. The DAC may be a current steering DAC. The sensor may further include a decimation filter coupled to an output of the SDM, wherein the feedback circuit is coupled to an output of the SDM, and wherein the decimation filter comprises at least one notch filter to reduce the ripple.

In embodiments, the sensor circuit includes a first decimation filter coupled to an output of the SDM and the feedback circuit is coupled to the output of the first decimation filter. The first decimation filter can have a first decimation rate of twice the frequency chopping rate. A second decimation filter can be coupled to an output of the first decimation filter. The second decimation filter can have a second decimation rate selected to adjust exponential decay of the ripple. The sensor circuit can further include a third decimation filter coupled to an output of the demodulator and to an input of the digital integrator. A gain circuit can be coupled to an output of the digital integrator and an input of the DAC. The gain circuit can be selected to adjust the ripple.

In embodiments, the sensor circuit can include a digital comparator coupled to the output of the third decimation filter and a gain boost control coupled to the chopper-stabilized amplifier circuit. The digital comparator can be configured to compare a value with zero. In embodiments, the digital comparator can be configured to compare an input of the digital integrator to zero. A gain of an amplifier of the chopper-stabilized amplifier circuit can be increased by the gain boost control in response to the input of the digital integrator being zero.

The chopper-stabilized amplifier circuit may include a first switch to receive signals from the at least one magnetic sensing element, a first amplifier configured to receives signals from the first switch, a second switch configured to receive signals from the first amplifier, a second amplifier configured to receive signals from the second switch, a third switch configured to receive signals from the second amplifier, and a third amplifier configured to receive signals from the third switch. The at least one magnetic sensing element may comprise at least one of a Hall effect element, a magnetoresistance element, or a magnetotransistor. The at least one Hall effect element may comprise one or more of a planar Hall element, a vertical Hall element or a Circular Vertical Hall (CVH) element. The at least one magnetoresistive element may comprise one or more of a giant magnetoresistance (GMR) element, an anisotropic magnetoresistance element (AMR), a tunneling magnetoresistance (TMR) element, and a magnetic tunnel junction (MTJ).

Also described is a sensor circuit including first means to receive a signal from at least one magnetic sensing element and generate a signal from a chopper-stabilized amplifier, a sigma-delta modulator (SDM) configured to receive a signal from the first means, and a feedback circuit configured to reduce a ripple in the signal generated by the first means. The feedback circuit may include a demodulator configured to demodulate a signal from the SDM in a digital domain by inverting a bit stream of the signal from the SDM according to a frequency chopping rate, a digital integrator configured to integrate an output signal of the demodulator to form an integrated signal, and second means to convert the integrated signal to an analog signal and to provide the analog signal to the first means.

Features may include one or more of the following individually or in combination with other features. A decimation filter may be coupled to an output of the SDM, wherein the feedback circuit is coupled to an output of the SDM, and wherein the decimation filter comprises at least one notch filter to reduce the ripple.

In embodiments, the sensor circuit includes a first decimation filter coupled to an output of the SDM and the feedback circuit is coupled to the output of the first decimation filter. The first decimation filter can have a first decimation rate of twice the frequency chopping rate. A second decimation filter can be coupled to an output of the first decimation filter. The second decimation filter can have a second decimation rate selected to adjust exponential decay of the ripple. The sensor circuit can further include a third decimation filter coupled to an output of the demodulator and to an input of the digital integrator. A gain circuit can be coupled to an output of the digital integrator and an input of the DAC. The gain circuit can be selected to adjust the ripple.

In embodiments, the sensor circuit can include a digital comparator coupled to the output of the third decimation filter and a gain boost control coupled to the chopper-stabilized amplifier circuit. The digital comparator can be configured to compare a value with zero. In embodiments, the digital comparator can be configured to compare an input of the digital integrator to zero. A gain of an amplifier of the chopper-stabilized amplifier circuit can be increased by the gain boost control in response to the input of the digital integrator being zero.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall Effect elements, magnetoresistance elements, or magnetotransistors. As is known, there are different types of Hall Effect elements, for example, planar Hall elements, vertical Hall elements, and circular vertical Hall (CVH) elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tends to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch, a proximity detector that senses the proximity of a ferromagnetic or magnetic object, a rotation detector that senses passing ferromagnetic articles, for example, gear teeth, and a magnetic field sensor (e.g., a linear magnetic field sensor) that senses a magnetic field density of a magnetic field. Linear magnetic field sensors are used as examples herein. However, the circuits and techniques described herein apply also to any magnetic field sensor capable of detecting a magnetic field.

As used herein, the term "magnetic field signal" is used to describe any circuit signal that results from a magnetic field experienced by a magnetic field sensing element.

While circuits are described below that use Hall elements in chopped arrangements and that have certain circuits to reduce undesirable spectral components resulting from the chopping, similar techniques can be used with other magnetic field sensors that support N-phase chopping, in order to reduce undesirable spectral components no matter what their source.

Figure 1:
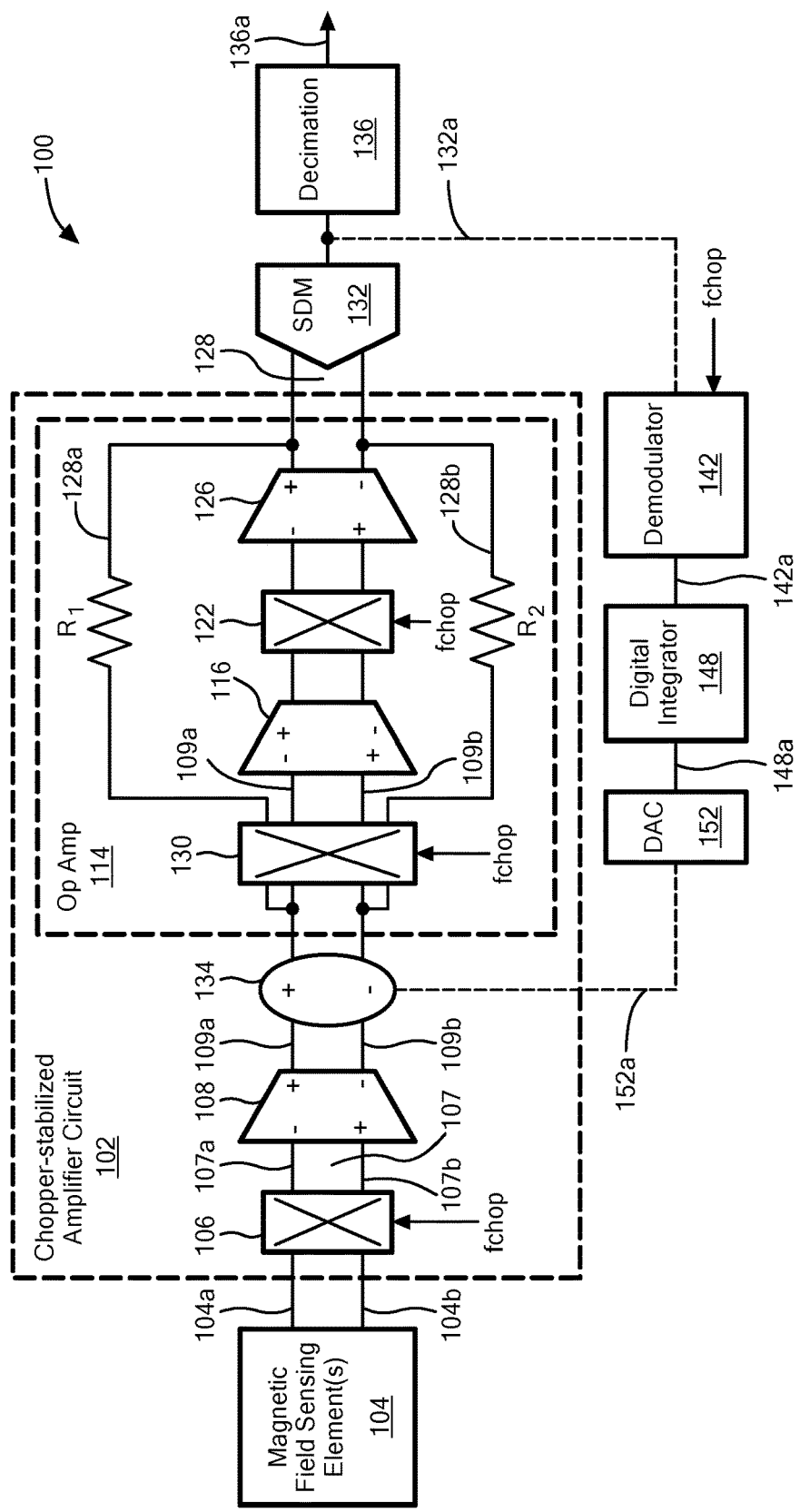
FIG. 1 is a block diagram of an example of a circuit to reduce ripple from chopper stabilization.

Referring to FIG. 1, a sensor 100, including circuits and techniques to reduce a ripple component of a signal generated by chopper stabilization, includes a chopper-stabilized amplifier circuit 102 responsive to one or more signals from a magnetic field sensing element 104, a sigma-delta modulator (SDM) 132 coupled to the chopper-stabilized amplifier circuit 102, and a decimation circuit 136 coupled to SDM 132. Sensor 100 also includes a feedback loop, or ripple reduction loop (RRL) that includes a demodulator 142 coupled to an output of the SDM 132, a digital integrator 148 coupled to the demodulator 142, and a digital-to-analog converter (DAC) 152 coupled to an output of the digital integrator 148 and to the chopper-stabilized amplifier 102.

With this configuration in which the ripple reduction loop includes the amplifier 102 and the SDM 132, a notch is provided in the signal transfer function of the SDM 132. More particularly, the notch is provided by demodulating the output of the SDM with demodulator 142 and digitally integrating the result with digital integrator 148. Demodulating can be achieved by inverting the bit stream 132a according to the chopping frequency, fchop. This avoids analog demodulation issues associated to parasitic capacitances and loading effects.

Integration by integrator 148 in the digital domain can be more desirable than conventional arrangements in which analog integration is performed, since analog integrators tend to require large capacitors for achieving large time constants and thus, tend to be costly in terms of area and other errors (like parasitic capacitance in chopper switches) which errors can adversely impact performance of the loop. As a result, the integrated signal 148a generated by the integrator 148 can be held as long as necessary without need of constant refresh. For example, in some embodiments, the feedback loop does not need to be active all the time and can be activated from time to time only (e.g., the feedback loop can be activated only if a certain delta temperature occurs which might generate some offset (and therefore) ripple drift).

The digital compensation signal 148a at the output of integrator 148 is representative of the chopped offset, which chopped offset is converted back to the analog domain by DAC 152 and subtracted from the chopped magnetic field signal by a summation element 134 in the amplifier circuit 102.

In the illustrated example, the converted compensation signal 152a is subtracted from the main path in the form of a current. Accordingly, a current steering DAC 152 can be used. In an embodiment, a ripple reduction factor of 100x (which is sufficient to maximize the input dynamic range of the SDM 132) requires no more than 7-bit precision in the DAC 152.

In this way, the ripple will tend to vanish over a few chopper clock cycles and therefore the SDM 132 will have virtually all of its input dynamic range available to digitize the sensed magnetic field signal (i.e., as opposed to having to process both the sensed signal and chopper generated ripple, which reduces the available input dynamic range) and saturation of the SDM will be avoided by removing ripple before the SDM (i.e., as opposed to relying on the decimation filter 136 to remove the ripple).

The chopper-stabilized amplifier 102 includes a switch, or modulator 106 that modulates a signal 104a, 104b received from a transducer 104 at a chopping frequency fchop, an amplifier 108 that receives a modulated signal 107a, 107b from the switch 106, and an op amp 114 that receives the output from the amplifier 108. An output signal of the op amp 114 is an output signal 128 of the chopper-stabilized amplifier circuit 102.

More particularly, the sensor 100 includes a magnetic field sensing element 104 here, in the form of a Hall Effect element, that provides positive and negative Hall plate signals 104a, 104b to an N-Phase modulator circuit 106. Chopping of the Hall plate signals by the modulator 106 results in the signal 107a, 107b (that corresponds to the magnetic field sensed by the Hall Effect element 104) being shifted to a frequency related to the chopping frequency. While the Hall Effect element 104 and modulator 106 are intended to illustrate a generalized N-phase chopping arrangement. An example chopping circuit is shown and described in detail in connection with a U.S. Patent Publication No. 2014/0009144, filed on Jul. 5, 2012, entitled "Magnetic Field Sensors and Associated Methods for Removing Undesirable Spectral Components" and assigned to the Assignee of the subject application.

Amplifier 108 can be coupled to receive the differential signal 107a, 107b and configured to generate an amplified differential output signal 109a, 109b. In some embodiments, the amplifier 108 is a transconductance amplifier.

Summation element 134 can be coupled to receive the differential signal 109a, 109b and the analog compensation signal 152a from the DAC 152. Summation element 134 is configured to provide a differential signal to op amp 114.

In one example, the op amp (operational amplifier) 114 is a two-stage amplifier that includes an amplifier 116, a switch 122 coupled to an output of the amplifier 116, and an amplifier 126 coupled to the switch 122 to receive a modulated signal from the switch 122. While the switch 106 modulates a signal, the switch 122 demodulates a signal at the chopping frequency fchop. That is, the switch 122 is used to recover the signal modulated by the switch 106. In this example, an output of the amplifier 126 is the output of the op amp 114 (i.e., the output signal 128 of the chopper-stabilized amplifier circuit 102).

In order to keep the op amp 114 in negative feedback (i.e., averting a positive feedback behavior) because of the behavior of the switch 122, a further switch 130 is provided in the op amp 114 to receive current signals from the output of the amplifier 126 (i.e., feedback from the op amp 114). To achieve this, the sign inversion in the feedback loop created by switch 122 has to be synchronously compensated for by switch 130. Therefore switch 130 is forced to operate at the exact same frequency as switch 122 and have the same clock phase. Since switch 130 is not in series with the op amp's input signal (summing circuit 134's outputs) it is then not chopping such signal. However please note switch 130 chops the amplified version of such input signal; that is the output of op amp 114. Such amplified version of the signal is chopped and fed back to the amplifier's input, such chopped fed back signal being the error signal that the negative feedback of the op amp is in charge of setting at the op amp's inputs, as any negative feedback circuit is expected to act.

Amplifiers 108, 116, and 126 can be transconductance amplifiers or other types of amplifiers such as voltage amplifiers.

The output signal 128 of the chopper-stabilized amplifier circuit 102 is coupled to the SDM 132 which digitizes the signal 128. Decimation filter 136 is coupled to an output of the SDM 132 to filter the output signal. In embodiments, the decimation filter 136 has a notch at a frequency selected to further reduce the ripple. In order to achieve the notch characteristics, the decimation rate needs to be set at a minimum value dictated by fclk/fchop, where fclk is the clock frequency driving the SDM block. Lower rates than that one would not provide the desired notch characteristics.

An output signal 136a of the decimation filter 136 can correspond to an output signal of the magnetic field sensor 100 and can be coupled to a processor (not shown) for further processing depending on the sensor application. Accordingly, it is desirable that the sensor output signal 136a consist only of signal components directly related to the magnetic field which the Hall Effect element 104 senses and not include undesirable signal components including ripple.

As explained above, a feedback loop including demodulator 142, integrator 148, and DAC 152 is configured to reduce the ripple caused by the chopping modulator 106. More particularly, the output signal 132a of the SDM 132 is demodulated by demodulator 142, as may be achieved by inverting the bit stream 132a according to the fchop rate.

The demodulated signal 142a is integrated by digital integrator 148 to generate a digital compensation signal 148a, which signal 148a is representative of the chopped offset. The digital compensation signal 148a is coupled to DAC 152 for conversion to an analog compensation signal 152a, which signal 152a is subtracted from the chopped magnetic field signal 109a, 109b to provide an input signal to the op amp 114.

While the illustrated DAC 152 is described as a current steering DAC configured to generate a current signal 152a for subtraction from the main signal path, it will be appreciated that other types of DACs are possible.

Figure 2:
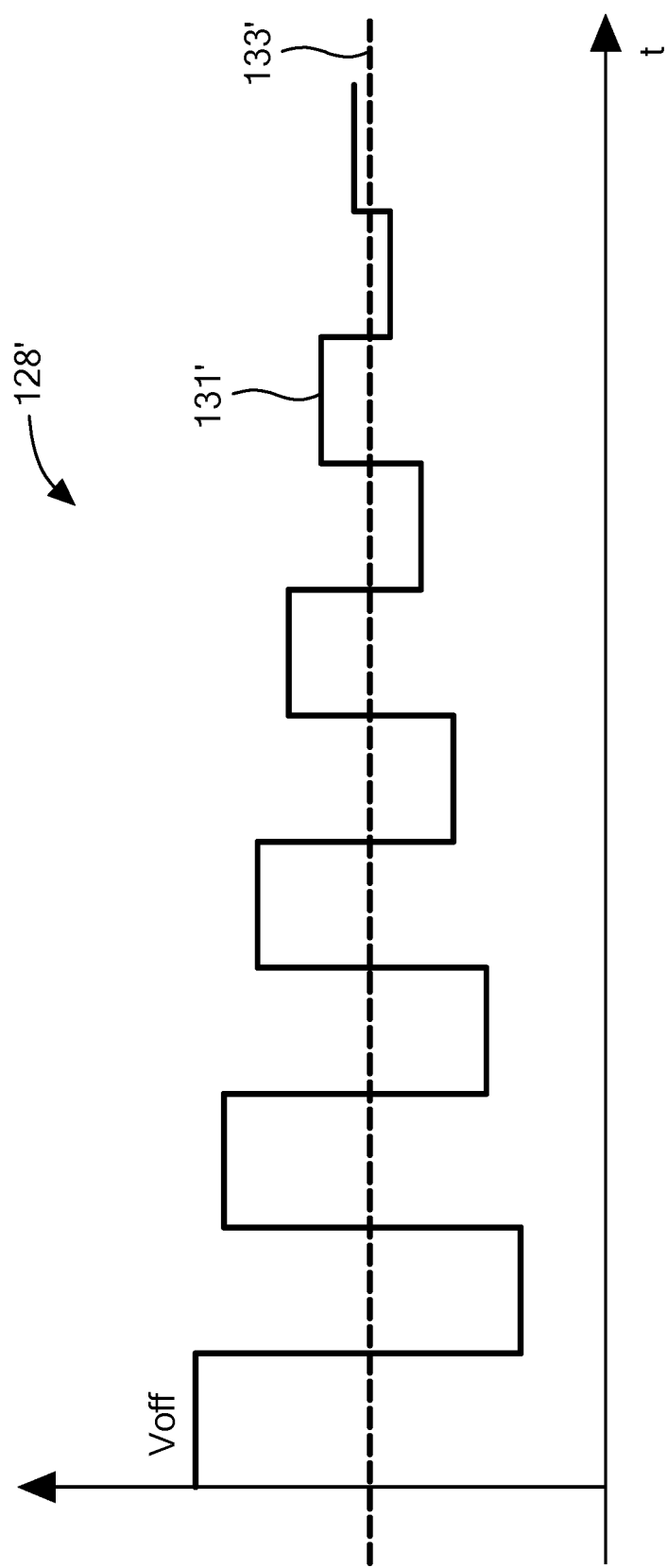
FIG. 2 is a graph of an example of a timing diagram.

Referring also to FIG. 2, an example of the chopper-stabilized amplifier output signal 128 is shown as signal 128' in which the horizontal axis has a scale in arbitrary units of time and the vertical axis has a scale in arbitrary units of volts. Signal 128' includes a ripple component, or ripple signal 131' and a sensed component, or sensed signal 133' corresponding to the sensed magnetic field. The frequency of the ripple signal 131' corresponds to the chopping frequency fchop. As is apparent, after several chopping cycles, the offset signal 131' has been significantly attenuated as is desired.

Figure 3:
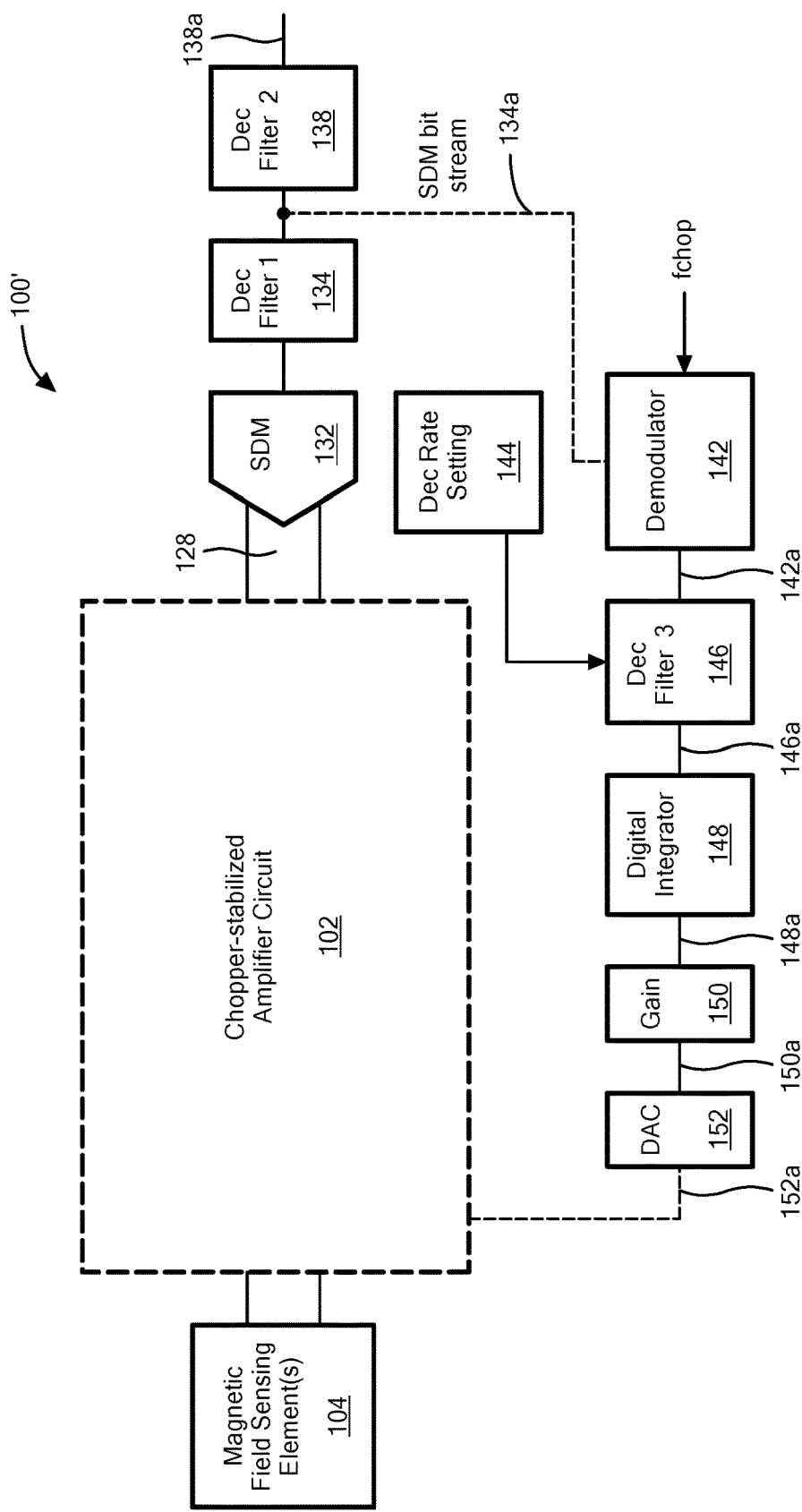
FIG. 3 is a block diagram of another example of a circuit to reduce ripple from chopper stabilization.

Referring to FIG. 3, in which like reference characters refer to like elements, an alternative sensor 100', including circuits and techniques to reduce a ripple component of a signal generated by chopper stabilization, includes chopper-stabilized amplifier circuit 102 responsive to one or more signals from a magnetic field sensing element 104, SDM 132 coupled to receive output signal 128 of the chopper-stabilized amplifier circuit 102, and a first decimation filter 134 coupled to an output of the SDM 132. Sensor 100' also includes a feedback loop, or ripple reduction loop (RRL) that includes demodulator 142 coupled to receive an output signal 134a of the first decimation filter 134, digital integrator 148, and DAC 152 to provide an analog compensation signal 152 to the chopper-stabilized amplifier 102. Thus, in this configuration, the feedback loop is closed around the first decimation filter 134, as shown. The decimation rate of the first decimation filter 134 can be equal to twice the chopping frequency fchop in order to thereby minimize aliasing.

A second decimation filter 138 can be coupled to an output of the first decimation filter as shown and provide at its output a signal 138a that can correspond to an output signal of the magnetic field sensor 100' and can be coupled to a processor (not shown) for further processing depending on the sensor application. Second decimation filter 138 can include at least one notch filter to reduce the ripple.

The ripple reduction feedback loop in FIG. 3 can include a third decimation filter 146 coupled to an output of demodulator 142. In embodiments, decimation filter 146 can have a variable decimation rate selected to adjust the exponential decay of the ripple as may be controlled by a decimation rate controller 144. For example, the decimation rate can be optimized to be fast enough to provide precise filtering, but slow enough to reduce noise. More particularly, if the decimation rate is small (i.e. higher bandwidth) there will be less filtering, thus more noise is allowed through, but the ripple exponential decay time is minimized. On the contrary, high decimation rates improve filtering and noise reduction at the expense of longer exponential decays.

An output signal 146a of the third decimation filter 146 is coupled to digital integrator 148, the output of which provides a digital compensation signal 148a that is representative of the chopped offset.

A gain module 150 can be coupled to receive the output signal 148a of the integrator 148 in order to permit the gain of the chopped offset signal 148a (i.e., the loop gain) to be adjusted in order to thereby adjust the residual ripple level.

The gain adjusted compensation signal 150a is converted to an analog compensation signal 152a for further coupling to the chopper-stabilized amplifier circuit 102. Analog compensation signal 152a can be a current signal as described above in connection with signal 152a of FIG. 1, in which case DAC 152 can be a current steering DAC and signal 152a can be a current signal subtracted from the main signal path of the amplifier 102.

Figure 4:
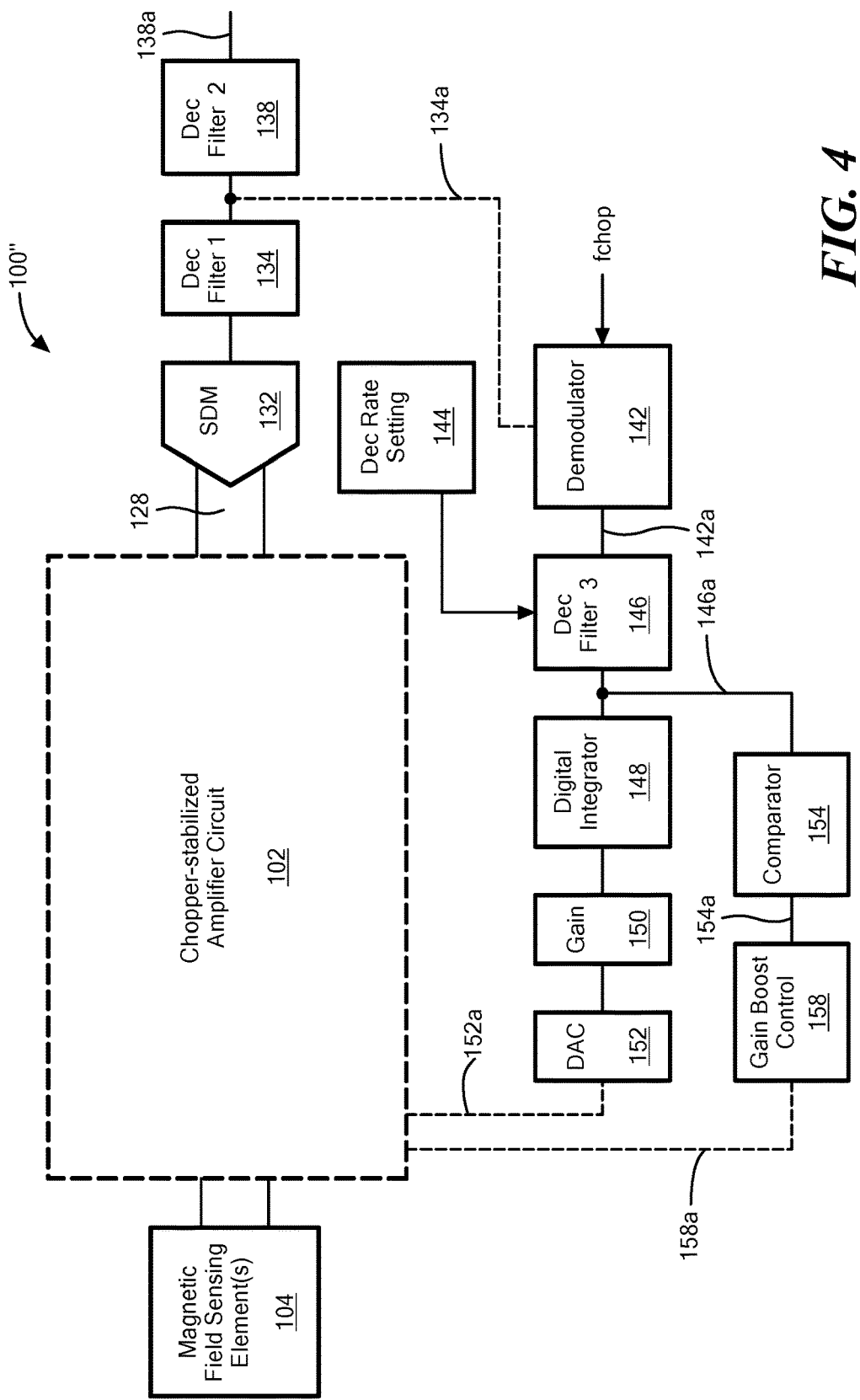
FIG. 4 is a block diagram of a further example of a circuit to reduce ripple from chopper stabilization.

Referring to FIG. 4, in which like reference characters refer to like elements, a further alternative sensor 100", including circuits and techniques to reduce a ripple component of a signal generated by chopper stabilization, includes the same elements as FIG. 3. The sensor 100" of FIG. 4 additionally includes a gain control loop.

More particularly, the output signal 146a of the third decimation filter 146 is coupled to an input of a comparator 154. Comparator 154 can be configured to compare the filter output signal 146a with a value of zero in order to determine when the ripple component has been eliminated (i.e., has been reduced to zero). It will be appreciated however, that the comparator 154 can alternatively compare the filter output signal 146a to a non-zero value if a non-zero ripple is acceptable.

A gain boost control circuit 158 can be coupled to receive an output signal 154a of the comparator 154 and can be configured to increase a gain of the chopper-stabilized amplifier 102 in response to a transition of the comparator output signal 154a (i.e., in response to an indication that the ripple signal has been canceled). More particularly, output signal 158a of the gain boost control circuit 158 can be coupled to various amplifiers of the chopper stabilized amplifier circuit 102 in order to thereby boost the loop gain once the ripple has been reduced to zero or at least to a sufficiently low level. Boosting the gain of the amplifier 102 can improve the signal to noise ratio of the SDM 132.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A sensor circuit comprising:
    a chopper-stabilized amplifier circuit configured to receive a signal from at least one magnetic sensing element;
    a sigma-delta modulator (SDM) configured to receive a signal from the chopper-stabilized amplifier circuit;
    a feedback circuit configured to reduce a ripple in a signal generated by the chopper-stabilized amplifier circuit, comprising:
        a demodulator to demodulate a signal from the SDM in a digital domain by inverting a bit stream of the signal from the SDM according to a frequency chopping rate;
        a digital integrator configured to integrate an output signal of the demodulator to form an integrated signal;
        a digital-to-analog converter (DAC) configured to convert the integrated signal to an analog signal and provide the analog signal to the chopper-stabilized amplifier circuit; and
        a first decimation filter coupled to an output of the SDM, wherein the feedback circuit is coupled to the output of the first decimation filter, wherein the first decimation filter uses a first decimation rate being twice the frequency chopping rate.

2. The sensor circuit of claim 1, wherein the DAC is a current steering DAC.

3. The sensor circuit of claim 1, further comprising a second decimation filter coupled to an output of the first decimation filter.

4. The sensor circuit of claim 3, wherein the second decimation filter comprises at least one notch filter to reduce the ripple.

5. The sensor circuit of claim 4, further comprising a third decimation filter coupled to an output of the demodulator and to an input of the digital integrator.

6. The sensor circuit of claim 5, wherein the third decimation filter uses a third decimation rate selected to adjust the exponential decay of the ripple.

7. The sensor circuit of claim 6, further comprising a gain circuit coupled to an output of the digital integrator and an input of the DAC.

8. The sensor circuit of claim 7, wherein the gain circuit is selected to adjust the ripple attenuation.

9. The sensor circuit of claim 7, further comprising:
    a digital comparator coupled to the output of the third decimation filter; and
    a gain boost control coupled to the chopper-stabilized amplifier circuit.

10. The sensor circuit of claim 9, wherein the digital comparator is configured to compare a value with zero.

11. The sensor circuit of claim 10, wherein the digital comparator is configured to compare an input of the digital integrator to zero.

12. The sensor circuit of claim 11, wherein a gain of an amplifier of the chopper-stabilized amplifier circuit is increased by the gain boost control in response to the input of the digital integrator being zero.

13. The sensor circuit of claim 1, wherein the chopper-stabilized amplifier circuit comprises:
    a first switch to receive signals from the at least one magnetic sensing element;
    a first amplifier configured to receives signals from the first switch;
    a second switch configured to receive signals from the first amplifier;
    a second amplifier configured to receive signals from the second switch;
    a third switch configured to receive signals from the second amplifier; and
    a third amplifier configured to receive signals from the third switch.

14. The sensor circuit of claim 1, wherein the at least one magnetic sensing element comprises at least one of a Hall effect element, a magnetoresistance element, or a magnetotransistor.

15. The sensor circuit of claim 14, wherein the at least one Hall effect element comprises one or more of a planar Hall element, a vertical Hall element or a Circular Vertical Hall (CVH) element.

16. The sensor circuit of claim 14, wherein the at least one magnetoresistive element comprises one or more of a giant magnetoresistance (GMR) element, an anisotropic magnetoresistance element (AMR), a tunneling magnetoresistance (TMR) element, and a magnetic tunnel junction (MTJ).

17. A sensor circuit comprising:
    a first means comprising a chopper-stabilized amplifier configured to receive a signal from at least one magnetic sensing element and generate a signal;
    a sigma-delta modulator (SDM) configured to receive a signal from the first means;
    a feedback circuit configured to reduce a ripple in the signal generated by the first means, comprising:
        a demodulator configured to demodulate a signal from the SDM in a digital domain by inverting a bit stream of the signal from the SDM according to a frequency chopping rate;
        a digital integrator configured to integrate an output signal of the demodulator to form an integrated signal;
        a second means to convert the integrated signal to an analog signal and to provide the analog signal to the first means; and
        a first decimation filter coupled to an output of the SDM, wherein the feedback circuit is coupled to the output of the first decimation filter, wherein the first decimation filter uses a first decimation rate being twice the frequency chopping rate.

18. The sensor circuit of claim 17, further comprising a second decimation filter coupled to an output of the first decimation filter.

19. The sensor circuit of claim 18, wherein the second decimation filter comprises at least one notch filter to reduce the ripple.

20. The sensor circuit of claim 19, further comprising a third decimation filter coupled to an output of the demodulator and to an input of the digital integrator.

21. The sensor circuit of claim 20, wherein the third decimation falter uses a third decimation rate selected to adjust the exponential decay of the ripple.

22. The sensor circuit of claim 21, further comprising a gain circuit coupled to an output of the digital integrator and an input of the second means,
wherein the gain circuit is selected to adjust the ripple.

23. The sensor circuit of claim 22, further comprising:
a digital comparator coupled to the output of the third decimation filter; and
a gain boost control coupled to the first means,
wherein the digital comparator compares a value with zero.

24. The sensor circuit of claim 23, wherein the digital comparator is configured to compare an input of the digital integrator to zero,
wherein a gain of an amplifier of the chopper-stabilized amplifier circuit is increased by the gain boost control in response to the input of the digital integrator being zero.

* * * * *

UNITED STATES PATENT AND TRADEMARK OFFICE
CERTIFICATE OF CORRECTION

PATENT NO. : 10,444,299 B2
APPLICATION NO. : 15/700603
DATED : October 15, 2019
INVENTOR(S) : Hernán D. Romero et al.

Page 1 of 1

It is certified that error appears in the above-identified patent and that said Letters Patent is hereby corrected as shown below:

In the Specification

Column 2, Line 33 delete "with demodulator" and replace with --with a demodulator--.

Column 2, Line 34 delete "with digital" and replace with --with a digital--.

Column 3, Line 16 delete "receives" and replace with --receive--.

Column 4, Line 47 delete "tends" and replace with --tend--.

Column 6, Line 24-25 delete "frequency. While the" and replace with --frequency. The--.

In the Claims

Column 11, Line 5 Claim 21 delete "falter" and replace with --filter--.

Column 11, Line 21 Claim 24 delete "amplifier circuit is" and replace with --amplifier is--.

Signed and Sealed this
Fifteenth Day of September, 2020

Andrei Iancu
*Director of the United States Patent and Trademark Office*